United States Patent
Hietala et al.

(10) Patent No.: US 10,770,802 B2
(45) Date of Patent: Sep. 8, 2020

(54) ANTENNA ON A DEVICE ASSEMBLY

(71) Applicant: RF Micro Devices, Inc., Greensboro, NC (US)

(72) Inventors: Alexander Wayne Hietala, Phoenix, AZ (US); Julio C. Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 1097 days.

(21) Appl. No.: 14/933,552

(22) Filed: Nov. 5, 2015

(65) Prior Publication Data

US 2016/0134014 A1    May 12, 2016

Related U.S. Application Data

(60) Provisional application No. 62/077,481, filed on Nov. 10, 2014.

(51) Int. Cl.
| | |
|---|---|
| *H01Q 1/38* | (2006.01) |
| *H01Q 19/10* | (2006.01) |
| *H01Q 1/24* | (2006.01) |
| *H01L 23/66* | (2006.01) |
| *H01L 23/552* | (2006.01) |
| *H01Q 21/06* | (2006.01) |
| *H01Q 1/40* | (2006.01) |
| *H01Q 9/04* | (2006.01) |

(Continued)

(52) U.S. Cl.
CPC ......... *H01Q 19/10* (2013.01); *H01L 23/5225* (2013.01); *H01L 23/552* (2013.01); *H01L 23/66* (2013.01); *H01Q 1/2283* (2013.01); *H01Q 1/243* (2013.01); *H01Q 1/40* (2013.01); *H01Q 9/0407* (2013.01); *H01Q 21/065* (2013.01); *H01L 24/13* (2013.01); *H01L 24/16* (2013.01); *H01L 2223/6677* (2013.01); *H01L 2224/13101* (2013.01); *H01L 2224/16225* (2013.01); *H01L 2924/10253* (2013.01)

(58) Field of Classification Search
CPC ...... H01Q 19/10; H01Q 1/243; H01Q 21/065; H01Q 1/40; H01Q 1/2283; H01Q 9/0407; H01L 23/5225; H01L 23/66; H01L 23/552
See application file for complete search history.

(56) References Cited

U.S. PATENT DOCUMENTS

| | | | |
|---|---|---|---|
| 5,861,843 A * | 1/1999 | Sorace ................... | H01Q 3/267 342/174 |
| 7,486,936 B2 | 2/2009 | Kappes et al. | |

(Continued)

OTHER PUBLICATIONS

Co-pending U.S. Appl. No. 13/852,648, filed Mar. 28, 2013.

(Continued)

*Primary Examiner* — Dieu Hien T Duong
(74) *Attorney, Agent, or Firm* — Withrow & Terranova, P.L.L.C.

(57) ABSTRACT

Aspects disclosed in the detailed description include an antenna on a device assembly. A device assembly includes a silicon device layer having at least one antenna. The device assembly also includes a polymer substrate that is formed with insulating material that does not interfere with the at least one antenna in the silicon device layer. As a result, it is unnecessary to shield the at least one antenna from the polymer substrate, thus allowing radio frequency (RF) signals radiating from the at least one antenna to pass through the polymer substrate.

19 Claims, 8 Drawing Sheets

(51) Int. Cl.
  *H01L 23/522* (2006.01)
  *H01Q 1/22* (2006.01)
  *H01L 23/00* (2006.01)

(56) References Cited

U.S. PATENT DOCUMENTS

| | | | |
|---|---|---|---|
| 7,570,209 | B2 | 8/2009 | Shi et al. |
| 7,693,494 | B2 | 4/2010 | Litmanen et al. |
| 7,724,189 | B2 | 5/2010 | Lee |
| 7,792,506 | B1 | 9/2010 | Wright |
| 7,812,775 | B2 | 10/2010 | Babakhani et al. |
| 7,873,335 | B2 | 1/2011 | Hug et al. |
| 7,894,782 | B2 | 2/2011 | Rofougaran |
| 8,154,345 | B2 | 4/2012 | Andrys et al. |
| 8,570,235 | B2 | 10/2013 | Ahn et al. |
| 9,002,297 | B2 | 4/2015 | Chen et al. |
| 9,197,162 | B2 | 11/2015 | Chiron et al. |
| 9,621,118 | B2 | 4/2017 | Ripley et al. |
| 9,948,242 | B2 | 4/2018 | Varner et al. |
| 2007/0188384 | A1* | 8/2007 | Liu ............ H01Q 1/526 343/700 MS |
| 2008/0278400 | A1* | 11/2008 | Lohninger ........ G01S 7/03 343/873 |
| 2010/0033395 | A1* | 2/2010 | Ding ............ H01Q 1/2283 343/834 |
| 2011/0000970 | A1* | 1/2011 | Abraham ....... G06K 19/07724 235/492 |
| 2014/0071021 | A1* | 3/2014 | Liu ............ H01L 23/5227 343/893 |
| 2014/0145884 | A1* | 5/2014 | Dang ............ H01Q 1/2283 343/700 MS |
| 2015/0255368 | A1 | 9/2015 | Costa |
| 2016/0087333 | A1* | 3/2016 | Tong ............ H01Q 1/523 343/873 |
| 2017/0317697 | A1 | 11/2017 | Motoi |
| 2018/0241122 | A1 | 8/2018 | Jalali Mazlouman et al. |
| 2018/0302045 | A1 | 10/2018 | Ishihara et al. |
| 2018/0341024 | A1 | 11/2018 | Shetty et al. |
| 2019/0036381 | A1 | 1/2019 | Hwang et al. |

OTHER PUBLICATIONS

Johannsen, U. et al., "Substrate Loss Reduction in Antenna-on-Chip Design," 2009 IEEE Antennas and Propagation Society International Symposium, 2009, IEEE, 4 pages.
Notice of Allowance for U.S. Appl. No. 15/935,081, dated Sep. 12, 2018, 8 pages.
Notice of Allowance for U.S. Appl. No. 16/373,776, dated Jun. 5, 2019, 8 pages.
Ex Parte Quayle Action for U.S. Appl. No. 16/195,894, dated Feb. 11, 2019, 7 pages.

* cited by examiner

ANTENNA ON A DEVICE ASSEMBLY

PRIORITY APPLICATIONS

This application claims the benefit of U.S. Provisional Patent Application Ser. No. 62/077,481, filed Nov. 10, 2014, which is incorporated herein by reference in its entirety.

FIELD OF THE DISCLOSURE

The technology of the disclosure relates generally to a device assembly.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being purely communication tools into sophisticated mobile entertainment centers, thus enabling enhanced user experiences.

Mobile communication devices such as smartphones typically include one or more antennas that may be flexibly configured and opportunistically reconfigured to support various usage scenarios. As more functionalities and components are added to the mobile communication devices, it is more efficient and cost effective to integrate these antennas into a semiconductor die. As such, it may be desirable to design the semiconductor die to ensure the best possible radio frequency (RF) performance of the antennas.

SUMMARY

Aspects disclosed in the detailed description include an antenna on a device assembly. A device assembly includes a silicon device layer having at least one antenna. The device assembly also includes a polymer substrate that is formed with insulating material that does not interfere with the at least one antenna in the silicon device layer. As a result, it is unnecessary to shield the at least one antenna from the polymer substrate, thus allowing radio frequency (RF) signals radiating from the at least one antenna to pass through the polymer substrate.

In this regard, in one aspect, a device assembly is provided. The device assembly comprises a polymer substrate having an upper surface and a lower surface. The device assembly also comprises a silicon device layer disposed on the lower surface of the polymer substrate. The device assembly also comprises at least one antenna provided in the silicon device layer wherein RF signals radiating from the at least one antenna pass through the polymer substrate.

In another aspect, a device assembly is provided. The device assembly comprises a polymer substrate having an upper surface and a lower surface. The device assembly also comprises a laminate region having an upper surface and a lower surface. The device assembly also comprises a silicon device layer disposed between the lower surface of the polymer substrate and the upper surface of the laminate region. The device assembly also comprises at least one antenna provided in the silicon device layer wherein RF signals radiating from the at least one antenna pass through the polymer substrate and the laminate region.

In another aspect, a device assembly is provided. The device assembly comprises a polymer substrate having an upper surface and a lower surface. The device assembly also comprises a laminate region having an upper surface and a lower surface. The device assembly also comprises a silicon device layer disposed between the lower surface of the polymer substrate and the upper surface of the laminate region. The device assembly also comprises at least one antenna provided in the silicon device layer wherein RF signals radiating from the at least one antenna pass through the polymer substrate and the laminate region. The device assembly also comprises a metal mesh provided on the upper surface of the polymer substrate and configured to control radiation patterns of the RF signals radiating from the at least one antenna.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Aspects disclosed in the detailed description include an antenna on a device assembly. A device assembly includes a silicon device layer having at least one antenna. The device assembly also includes a polymer substrate that is formed with insulating material that does not interfere with the at least one antenna in the silicon device layer. As a result, it is unnecessary to shield the at least one antenna from the polymer substrate, thus allowing radio frequency (RF) signals radiating from the at least one antenna to pass through the polymer substrate.

Figure 1:
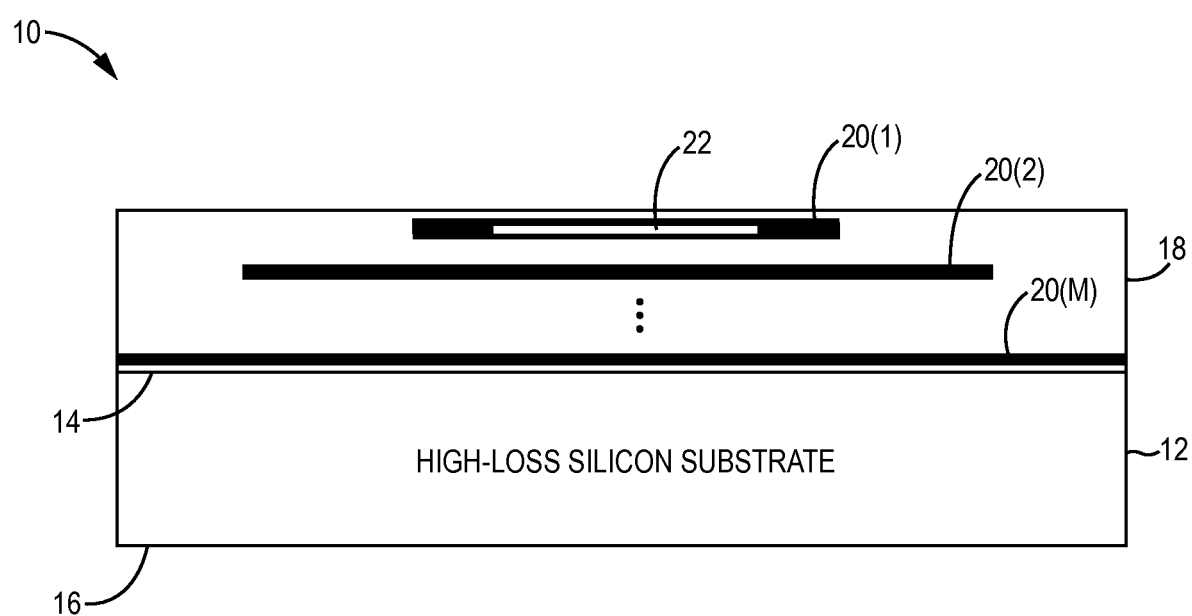
FIG. 1 is a schematic diagram of an exemplary conventional silicon die having a high-loss silicon substrate.

Before discussing aspects of integrating an antenna on a device assembly that includes specific aspects of the present disclosure, a brief overview of a conventional silicon die having a high-loss silicon substrate is provided with reference to FIG. 1. The discussion of specific exemplary aspects of integrating an antenna on a device assembly starts below with reference to FIG. 2.

In this regard, FIG. 1 is a schematic diagram of an exemplary conventional silicon die 10 having a high-loss silicon substrate 12. The high-loss silicon substrate 12, which is formed by conductive material, has an upper surface 14 and a lower surface 16. The conventional silicon die 10 also includes a device layer 18 provided on the upper surface 14 of the high-loss silicon substrate 12. The device layer 18 includes a plurality of metal layers 20(1)-20(M) disposed in parallel to the upper surface 14 of the high-loss silicon substrate 12. The device layer 18 also includes an antenna 22 that is provided on one or more of the plurality of metal layers 20(1)-20(M).

The antenna 22 is susceptible to interference that may be caused by the conductive material in the high-loss silicon substrate 12. As such, the metal layer 20(M), which is the metal layer closest to the high-loss silicon substrate 12, is typically provided as a solid ground plane to shield the antenna 22 from the high-loss silicon substrate 12, thus isolating the interference caused by the conductive material in the high-loss silicon substrate 12 from the antenna 22. In addition, the antenna 22 is typically provided on the metal layer 20(1), which is the metal layer farthest from the high-loss silicon substrate 12, to further isolate the antenna 22 from the high-loss silicon substrate 12. Such antenna arrangement in the conventional silicon die 10 imposes strict restriction on how the antenna 22 can be provided in the device layer 18, thus reducing design flexibility for the conventional silicon die 10. In addition, active components (not shown) disposed between the antenna 22 and the high-loss silicon substrate 12 (e.g., on the metal layer 20(2)) can cause impedance mismatch in the device layer 18 and compromise overall performance of the conventional silicon die 10. Therefore, it may be desired to provide more design flexibility and less placement restriction when integrating the antenna 22 into the conventional silicon die 10.

Figure 2:
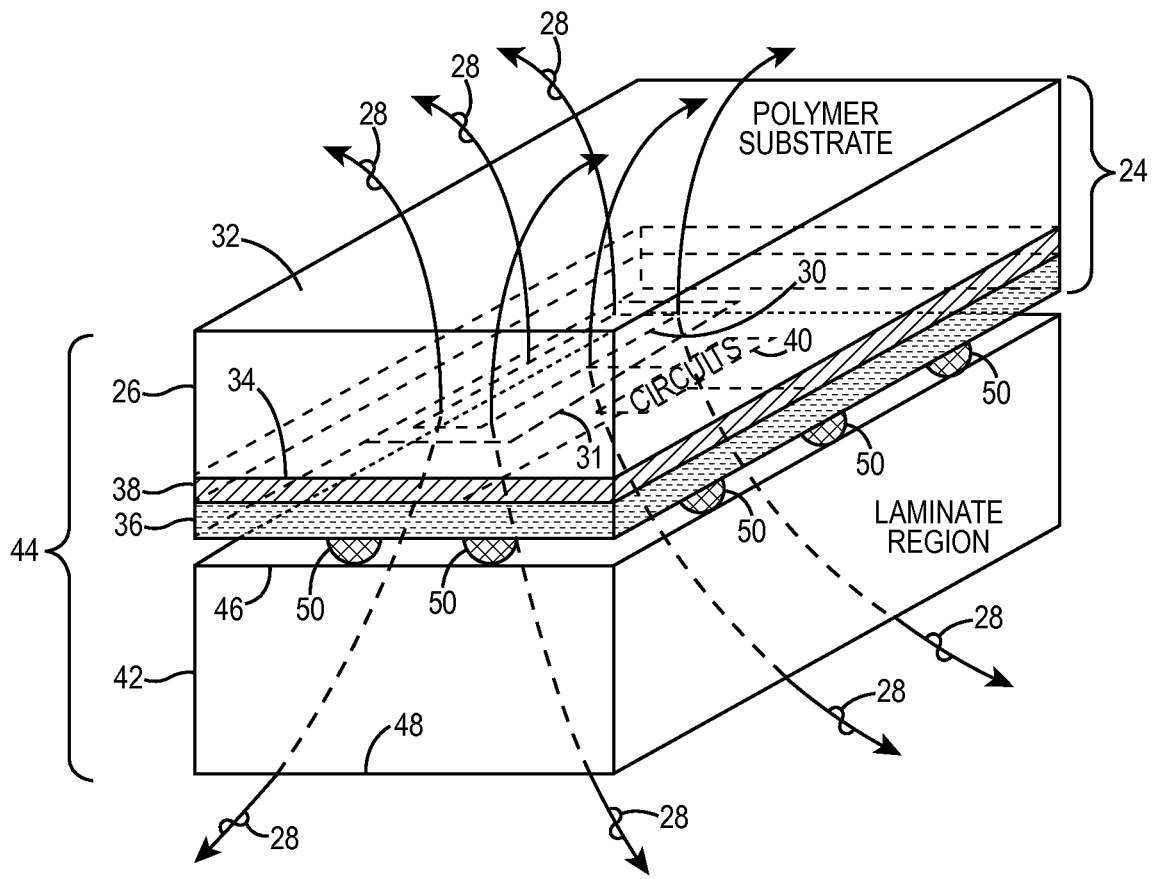
FIG. 2 is a schematic diagram of an exemplary device assembly including a polymer substrate that allows radio frequency (RF) signals radiating from at least one antenna to pass through the polymer substrate.

In this regard, FIG. 2 is a schematic diagram of an exemplary device assembly 24 including a polymer substrate 26 that allows RF signals 28 radiating from at least one antenna 30 to pass through the polymer substrate 26. The polymer substrate 26 has an upper surface 32 and a lower surface 34. The at least one antenna 30 is provided in a silicon device layer 36 that is disposed on the lower surface 34 of the polymer substrate 26. In a non-limiting example, the at least one antenna 30 is a planar antenna and resides in a plane 31 disposed in parallel to the silicon device layer 36. The device assembly 24 may also have an oxide layer 38 disposed between the lower surface 34 of the polymer substrate 26 and the silicon device layer 36.

Unlike the high-loss silicon substrate 12 in the conventional silicon die 10, the polymer substrate 26 in the device assembly 24 is formed by material that is substantially an electrical insulator and does not cause interference to the at least one antenna 30. Therefore, it is unnecessary to shield the at least one antenna 30 from the polymer substrate 26 with a metal ground shield like the solid ground plane in FIG. 1, for example. As such, the RF signal 28 radiating from the at least one antenna 30 can pass through polymer substrate 26 without being significantly degraded. Furthermore, it is also unnecessary to place the at least one antenna 30 as far away as possible from the polymer substrate 26 as in the conventional silicon die 10. In other words, the at least one antenna 30 may be provided on any metal layer (not shown) in the silicon device layer 36, thus eliminating antenna placement restrictions and providing more design flexibility for the device assembly 24. The silicon device layer 36 may further include one or more circuits 40 electrically coupled to the at least one antenna 30. As is shown and discussed later in FIG. 4, the one or more circuits 40 and the at least one antenna 30 may be provided on different metal layers in the silicon device layer 36.

In a non-limiting example, the polymer substrate 26 may be provided in the device assembly 24 based on the manufacturing methods discussed in U.S. Patent Application Publication No. 2015/0255368 A1 entitled "Silicon-on-Plastic Semiconductor Device with Interfacial Adhesion Layer," now U.S. Pat. No. 9,812,350, incorporated herein by reference in its entirety. It may also be possible to modify the polymer substrate 26 to enhance or modify antenna propagation by adding additives throughout the polymer substrate 26 or in localized regions (not shown) inside the polymer substrate 26. In a first non-limiting example, such additives added to the polymer substrate 26 may be made by adding long ceramic platelets to the resin. When the resin is compressed, it may enhance the propagation horizontally while attenuating propagation in all other directions. In a second non-limiting example, the additive added to the polymer substrate 26 may modify permittivity in the polymer substrate 26. In a third non-limiting example, it may also be possible to add ferromagnetic or carbon nanotube structures to the polymer substrate 26.

The device assembly 24 may be mounted onto a laminate region 42 to form a silicon structure 44. The laminate region 42 includes an upper surface 46 and a lower surface 48. In a non-limiting example, the device assembly 24 may be mounted on the upper surface 46 of the laminate region 42 as a flip-chip via a plurality of soldering bumps 50. Through laminate metals (not shown) disposed in the laminate region 42, the at least one antenna 30 and the one or more circuits 40 in the silicon device layer 36 may be electrically coupled to circuitries (not shown) external to the device assembly 24. The RF signals 28 radiating from the at least one antenna 30 can also pass through the laminate region 42 without being significantly degraded. By being able to pass the RF signals 28 through both the polymer substrate 26 and the laminate region 42, the silicon structure 44 can be designed to turn the at least one antenna 30 into an electrically-steerable array antenna that is highly desirable in higher frequency (e.g., ten gigahertz (10 GHz) and above) communication systems.

Figure 3:
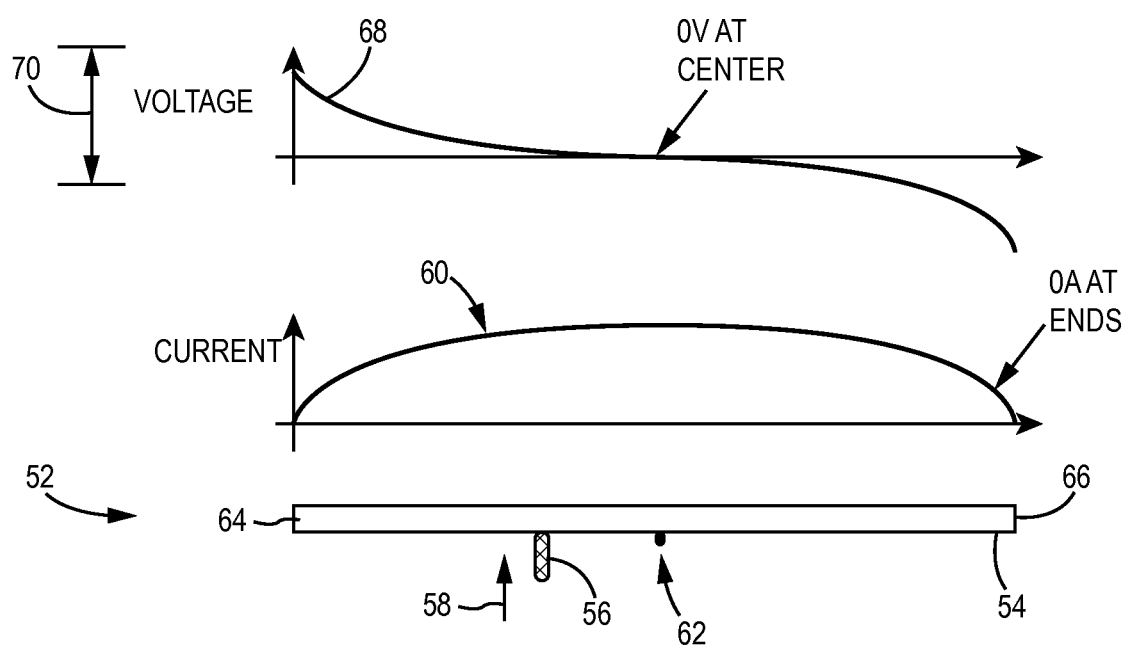
FIG. 3 is a schematic diagram providing an exemplary illustration of electrical characteristics of an exemplary patch antenna.

In a non-limiting example, the at least one antenna 30 in the device assembly 24 may be one or more patch antennas. In this regard, FIG. 3 is a schematic diagram providing an exemplary illustration of electrical characteristics of an exemplary patch antenna 52. The patch antenna 52 includes a metal sheet 54, which may be a rectangular metal sheet, and a feeding point 56 that receives an electrical current 58 from an electrical current source (not shown). The length of the metal sheet 54 is one-half wavelength of a resonant frequency. For example, if the metal sheet 54 is made of material with a dielectric constant ($\in_r$) equal to four (4) and provided with the resonant frequency of sixty gigahertz (60

GHz), the length of the metal sheet 54 is six hundred twenty-five micrometers (625 μm).

As shown in a current curve 60, the electrical current 58 is maximized at a center point 62 of the metal sheet 54. Further, the electrical current 58 drops to zero at a first end 64 and a second end 66 of the metal sheet 54 because the metal sheet 54 is open circuited. In contrast, as shown in a voltage curve 68, a voltage 70 is zero at the center point 62 and maximized at the first end 64 and the second end 66, thus allowing the RF signals 28 of FIG. 2 (not shown) to radiate from the first end 64 and the second end 66. The patch antenna 52 is hereinafter discussed as a non-limiting example of the at least one antenna 30 of FIG. 2.

Figure 4:
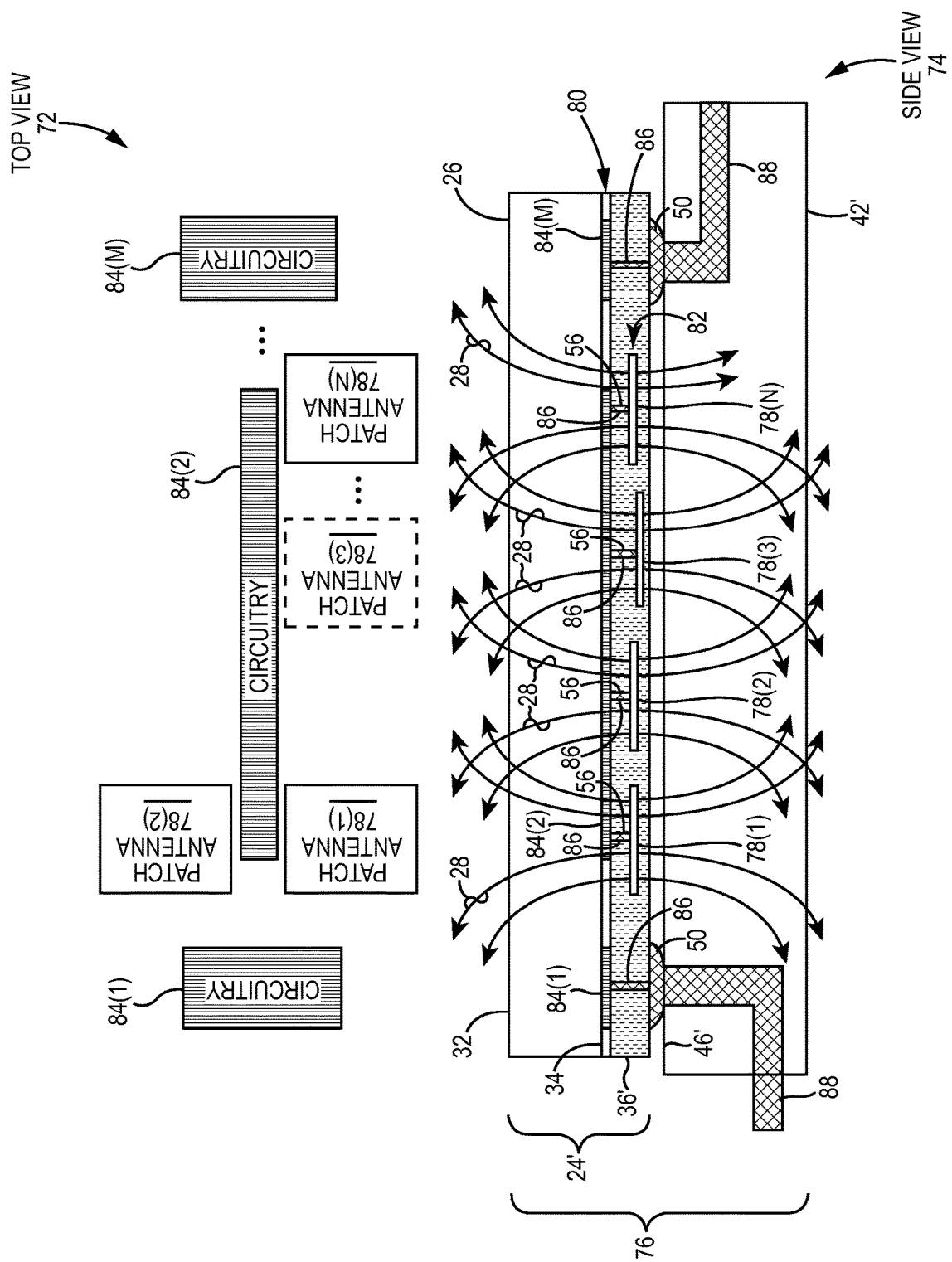
FIG. 4 is a schematic diagram of an exemplary top view and an exemplary side view of an exemplary silicon structure that includes the polymer substrate of FIG. 2.

FIG. 4 is a schematic diagram of an exemplary top view 72 and an exemplary side view 74 of an exemplary silicon structure 76 that includes the polymer substrate 26 of FIG. 2. Common elements between FIGS. 2, 3, and 4 are shown therein with common element numbers and thus, will not be re-described herein.

With reference to FIG. 4, the silicon structure 76 includes a device assembly 24'. The device assembly 24' includes one or more patch antennas 78(1)-78(N) that are functionally equivalent to the at least one antenna 30 in the device assembly 24 of FIG. 2. The one or more patch antennas 78(1)-78(N) may be driven by varying phase and amplitude to form an electrically-steerable antenna array (not shown). The one or more patch antennas 78(1)-78(N) are provided in a silicon device layer 36' that is disposed on the lower surface 34 of the polymer substrate 26. The silicon device layer 36' includes at least one first conducting layer 80 and at least one second conducting layer 82. The device assembly 24' also includes one or more circuitries 84(1)-84(M) that are provided on the at least one first conducting layer 80. The one or more patch antennas 78(1)-78(N) are provided on the at least one second conducting layer 82. In this regard, the one or more patch antennas 78(1)-78(N) may also be provided on the same conducting layers. For example, the patch antenna 78(1) and the patch antenna 78(3) may be provided on different conducting layers among the at least one second conducting layer 82. The one or more patch antennas 78(1)-78(N) are electrically coupled to the one or more circuitries 84(1)-84(M) via one or more feeding points 56 that are set in the silicon device layer 36' through one or more vias 86. In a non-limiting example, it is also possible to provide the one or more patch antennas 78(1)-78(N) on the at least one first conducting layer 80 with the one or more circuitries 84(1)-84(M). In another non-limiting example, the silicon device layer 36' may also include a diffusion layer (not shown) or a poly-silicon layer (not shown) on which the one or more patch antennas 78(1)-78(N) may be disposed.

The device assembly 24' is mounted onto an upper surface 46' of a laminate region 42' as a flip-chip via the plurality of soldering bumps 50. The laminate region 42' includes one or more laminate metals 88 that electrically couple to the one or more circuitries 84(1)-84(M) via the one or more vias 86. As such, the one or more circuitries 84(1)-84(M) may be electrically coupled to circuitries (not shown) external to the device assembly 24'. According to previous discussions in FIG. 2, the RF signals 28 radiating from the one or more patch antennas 78(1)-78(N) can radiate upwards through the polymer substrate 26 and downwards through the laminate region 42'.

Figure 5:
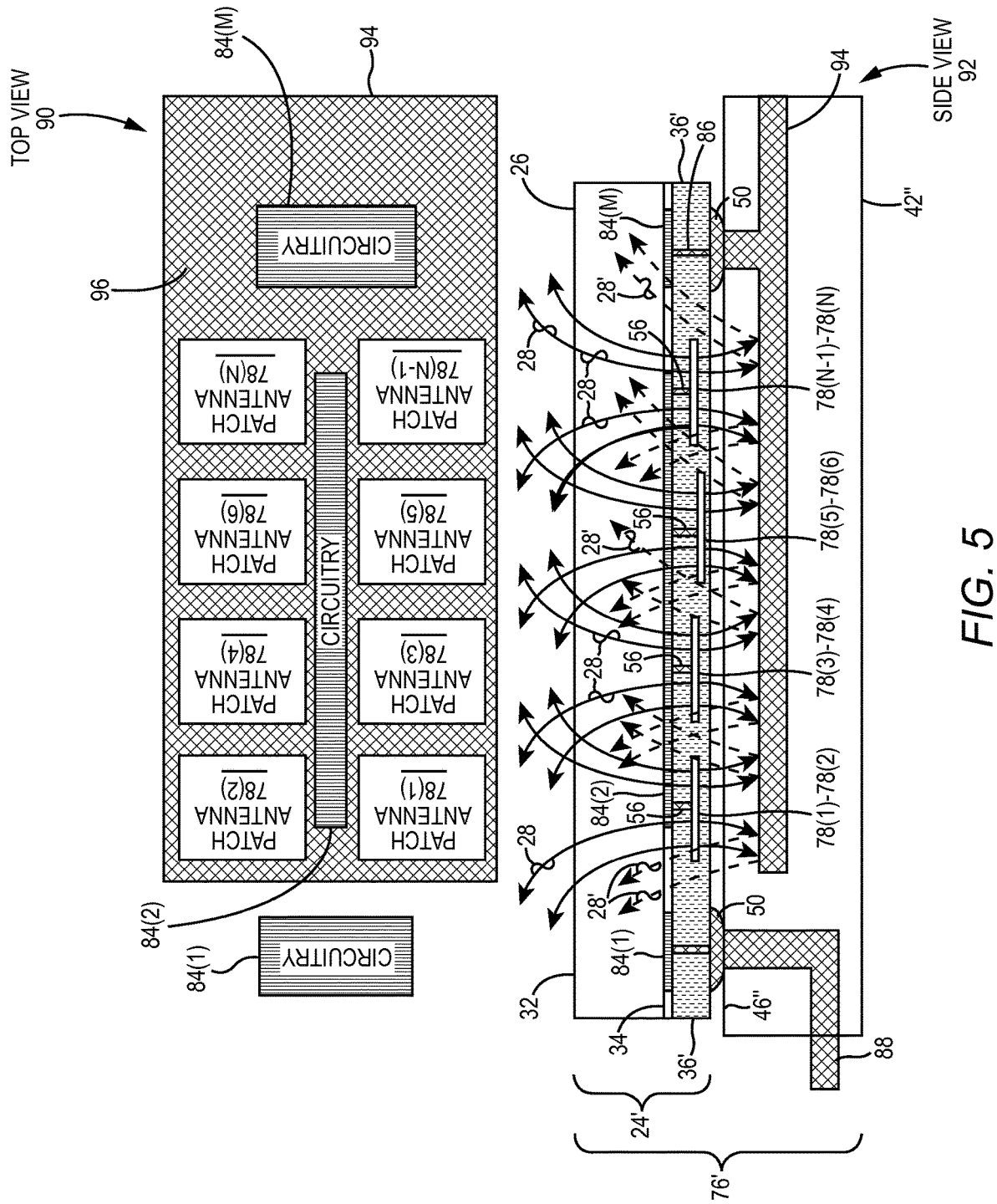
FIG. 5 is a schematic diagram of an exemplary top view and an exemplary side view of an exemplary silicon structure configured to steer radiation of the RF signals of FIG. 2 toward one side of the silicon structure.

The silicon structure 76 may be provided in communication devices such as smartphones. In this regard, it may be necessary to steer the RF signals 28 radiating from the one or more patch antennas 78(1)-78(N) toward one side of the silicon structure 76. For example, when a user places a smartphone by his or her ear to have a voice conversation, it is required by regulatory authorities such as the Federal Communications Commission (FCC) in the United States to steer radiation of the RF signals 28 away from the user's head. In this regard, FIG. 5 is a schematic diagram of an exemplary top view 90 and an exemplary side view 92 of an exemplary silicon structure 76' configured to steer radiation of the RF signals 28 toward one side of the silicon structure 76'. Common elements between FIGS. 4 and 5 are shown therein with common element numbers and thus, will not be re-described herein.

In the silicon structure 76', a laminate region 42'' includes at least one conducting layer 94 that forms a metal ground shield 94. The device assembly 24' is mounted on an upper surface 46'' of the laminate region 42'' via the plurality of soldering bumps 50. The metal ground shield 94 is disposed in parallel to the device assembly 24' and the one or more patch antennas 78(1)-78(N). As illustrated in the top view 90, the metal ground shield 94 has a coverage area 96 encompassing the one or more patch antennas 78(1)-78(N). The metal ground shield 94 reflects the RF signals 28 radiating from the one or more patch antennas 78(1)-78(N) upward as reflected RF signals 28'. As a result, there is no radiation of the RF signals 28 through the laminate region 42''.

Figure 6:
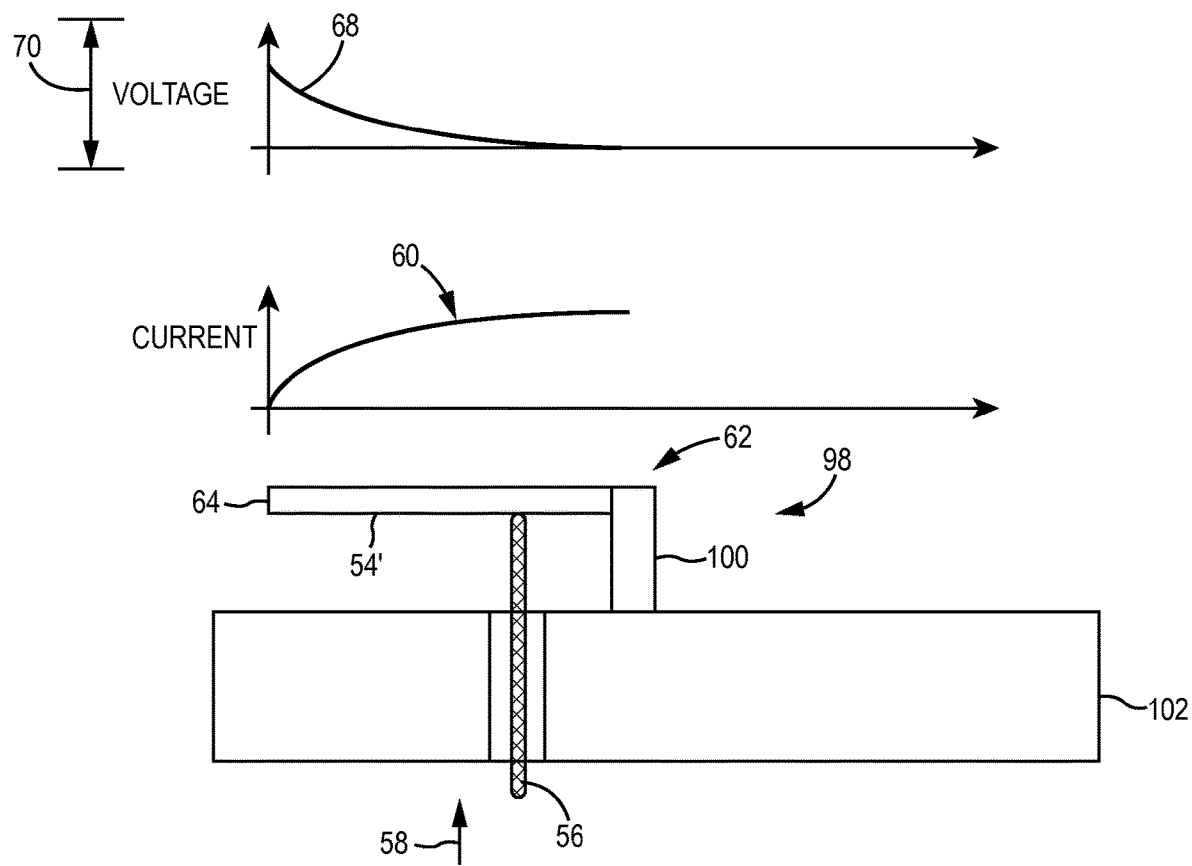
FIG. 6 is a schematic diagram providing an exemplary illustration of electrical characteristics of an exemplary planar inverted-F antenna (PIFA) that is modified based on the patch antenna of FIG. 3.

As it is widely anticipated that the next generation of wireless communication devices, such as the fifth generation (5G) communication device, will be based on higher RF frequencies (e.g., 10 GHz and above) with shorter wavelengths, it is possible and necessary to miniaturize the one or more patch antennas 78(1)-78(N). In this regard, FIG. 6 is a schematic diagram providing an exemplary illustration of electrical characteristics of an exemplary planar inverted-F antenna (PIFA) 98 that is modified based on the patch antenna 52 of FIG. 3.

As previously discussed in FIG. 3, the electrical current 58 is maximized at the center point 62 while the voltage 70 is zero at the center point 62. Since the voltage 70 at the center point 62 is zero, the impedance at the center point 62 is also zero. Therefore, the center point 62 is effectively a short circuit. As such, it is possible to provide a shorting post 100 at the center point 62 and cut away the metal sheet 54 from the center point 62 to the second end 66 to form the PIFA 98. As illustrated in FIG. 6, the PIFA 98 has a metal sheet 54' that is one-half of the length of the metal sheet 54 in the patch antenna 52 of FIG. 3. For example, if the metal sheet 54' again is made of material with the $\in_r$ equal to 4 and provided with the resonant frequency of 60 GHz, the length of the metal sheet 54' will then be three hundred twelve and one-half micrometers (321.5 μm). The shorting post 100 is electrically coupled to a metal ground shield 102 and the PIFA 98 radiates from the first end 64.

Figure 7:
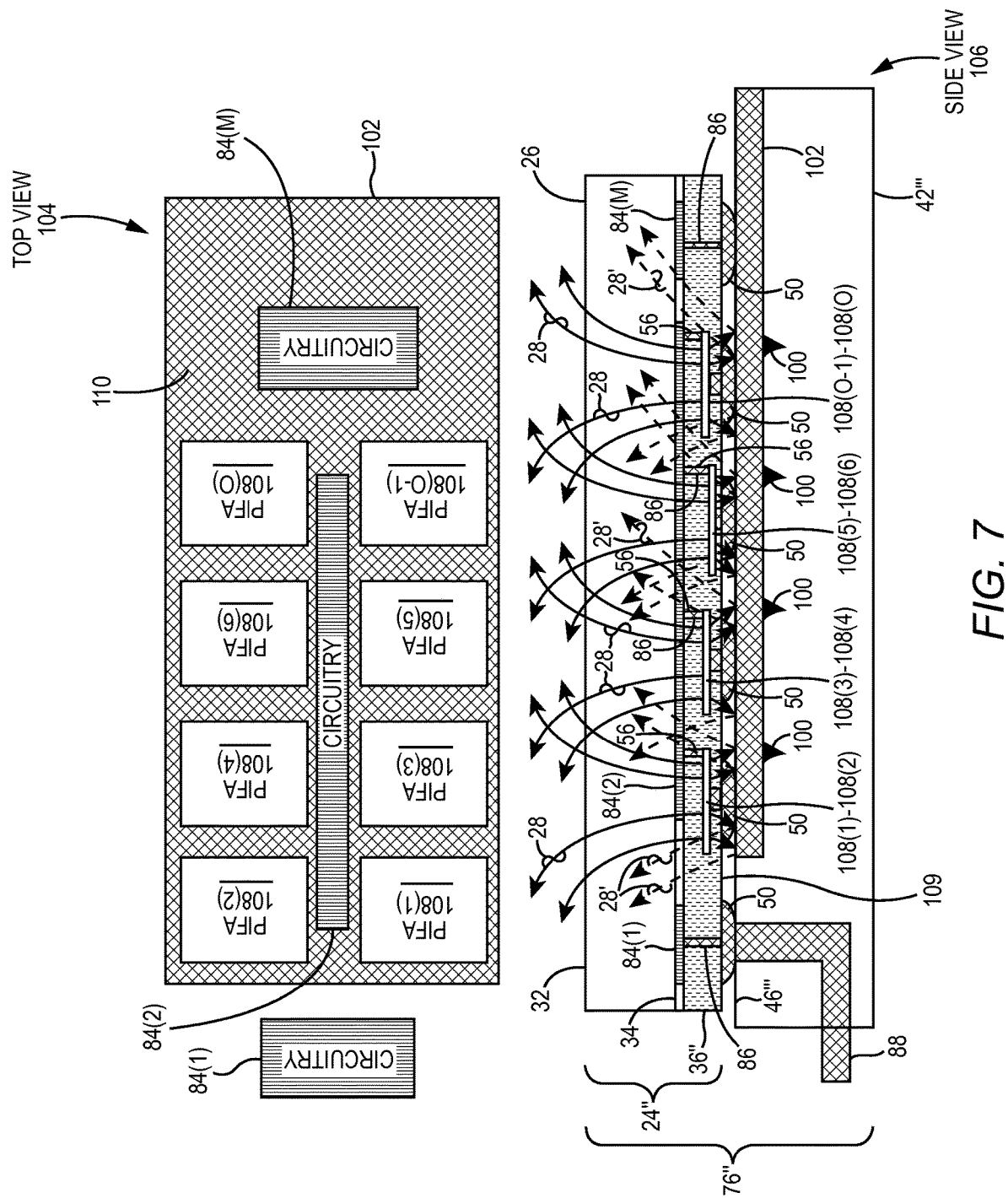
FIG. 7 is a schematic diagram of an exemplary top view and an exemplary side view of an exemplary silicon structure that includes one or more planar inverted-F antennas (PIFAs) in a device assembly.

FIG. 7 is a schematic diagram of an exemplary top view 104 and an exemplary side view 106 of an exemplary silicon structure 76'' that includes one or more PIFAs 108(1)-108(O) in a device assembly 24''. Common elements between FIGS. 4, 5, 6, and 7 are shown therein with common element numbers and thus, will not be re-described herein.

With reference to FIG. 7, in a non-limiting example, the metal ground shield 102 is disposed on an upper surface 46''' of a laminate region 42'''. Each of the one or more PIFAs 108(1)-108(O) has the respective shorting post 100 that couples the PIFA 108(1)-108(O) to the metal ground shield 102. In another non-limiting example, the metal ground shield 102 may also be a metal layer (not shown) that is closest to a lower surface 109 of a device layer 36''. As such, each of the one or more PIFAs 108(1)-108(O) is coupled to the metal layer in the device layer 36" by the respective shorting post 100. The metal ground shield 102 has a coverage area 110 that encompasses the one or more PIFAs 108(1)-108(O). As such, the RF signals 28 radiating from the one or more PIFAs 108(1)-108(O) cannot pass through a laminate region 42'''. Although the metal ground shield 102 is shown to be provided on an upper surface 46''' of the laminate region 42''', it shall be appreciated that the metal ground shield 102 can also be provided anywhere in the laminate region 42''' if larger spacing is required between the one or more PIFAs 108(1)-108(O) and the metal ground shield 102.

Figure 8:
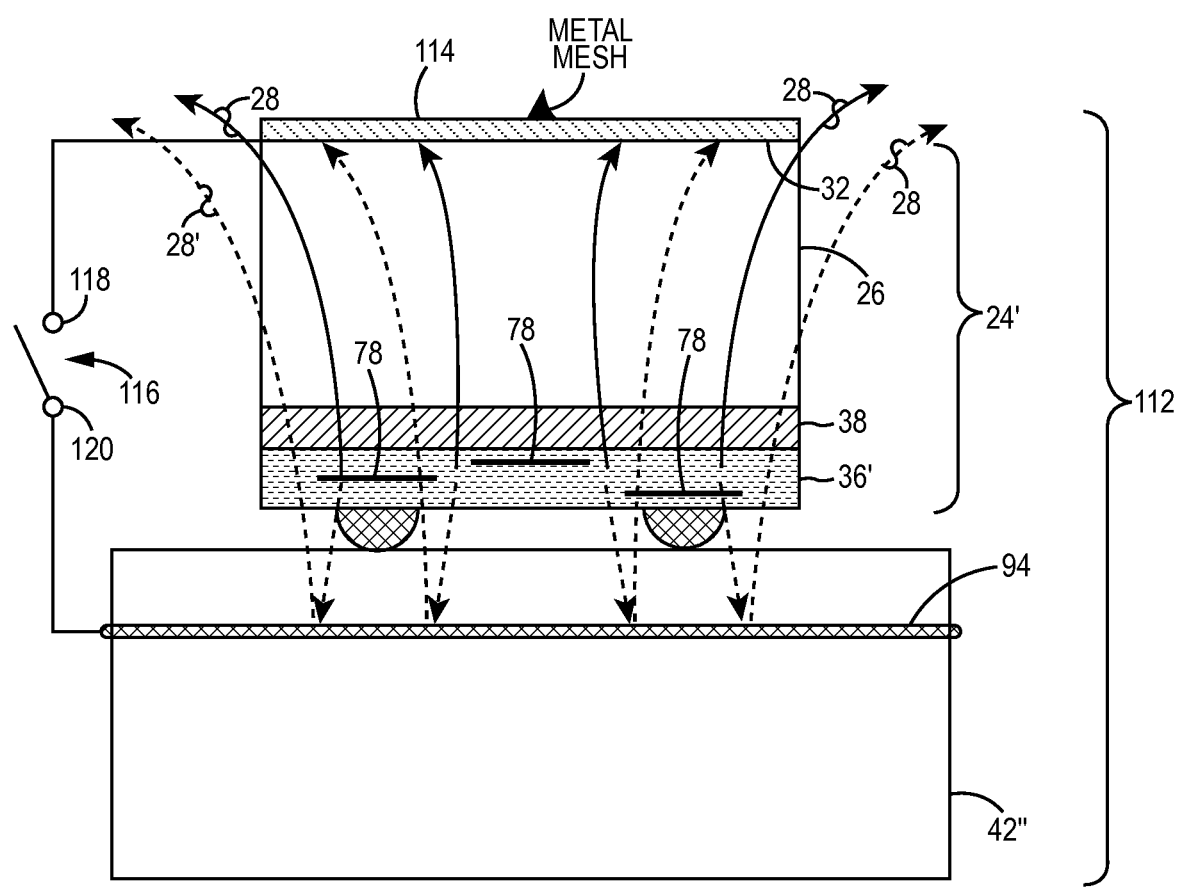
FIG. 8 is a schematic diagram of an exemplary silicon structure in which a metal mesh is provided on an upper surface of a polymer substrate to control a radiation pattern of the RF signal of FIG. 5.

As previously discussed in FIG. 5, the metal ground shield 94 reflects the RF signals 28 radiating from the one or more patch antennas 78(1)-78(N) upwards as the reflected RF signals 28'. In some applications, it may be desirable to control radiation pattern and/or strength of the RF signals 28 and the reflected RF signals 28'. In this regard, FIG. 8 is a schematic diagram of an exemplary silicon structure 112 in which a metal mesh 114 is provided on the upper surface 32 of the polymer substrate 26 of FIG. 5 to control the radiation pattern of the RF signal 28 and the reflected RF signal 28'. Common elements between FIGS. 5 and 8 are shown therein with common element numbers and thus, will not be re-described herein.

With reference to FIG. 8, the metal mesh 114 may be provided with different patterns (not shown) and/or shapes (not shown) to help control the radiation pattern of the RF signals 28 and the reflected RF signals 28'. To control signal strength of the RF signals 28 and the reflected RF signals 28', an attenuation switch 116 may be provided. The attenuation switch 116 has a first end 118 coupled to the metal mesh 114 and a second end 120 coupled to the metal ground shield 94 in the laminate region 42''. When the attenuation switch 116 is closed, the metal mesh 114 is directly coupled to the metal ground shield 94, thus causing the RF signals 28 and the reflected RF signals 28' to be attenuated. In contrast, when the attenuation switch 116 is open, the metal mesh 114 is decoupled from the metal ground shield 94. As a result, the RF signals 28 and the reflected RF signals 28' are not attenuated.

Those skilled in the art will recognize improvements and modifications to the embodiments of the present disclosure. All such improvements and modifications are considered within the scope of the concepts disclosed herein and the claims that follow.

What is claimed is:

1. A device assembly comprising:
   a polymer substrate having an upper surface and a lower surface;
   a silicon device layer disposed on the lower surface of the polymer substrate;
   at least one antenna provided in the silicon device layer, wherein radio frequency (RF) signals radiating from the at least one antenna pass through the polymer substrate;
   a metal ground shield separated from the polymer substrate by the silicon device layer;
   a metal mesh provided on the upper surface of the polymer substrate; and
   an attenuation switch having a first end coupled to the metal mesh and a second end coupled to the metal ground shield.

2. The device assembly of claim 1 wherein the at least one antenna is planar and resides in a plane parallel to the silicon device layer.

3. The device assembly of claim 1 wherein the at least one antenna is a patch antenna.

4. The device assembly of claim 1 further comprising an oxide layer disposed between the lower surface of the polymer substrate and the silicon device layer.

5. The device assembly of claim 1 wherein the silicon device layer comprises at least one first conducting layer and at least one second conducting layer disposed in parallel to the lower surface of the polymer substrate.

6. The device assembly of claim 5 further comprising one or more circuitries provided on the at least one first conducting layer and electrically coupled to the at least one antenna provided on the at least one second conducting layer.

7. The device assembly of claim 1 wherein the silicon device layer is mounted on an upper surface of a laminate region via a plurality of soldering bumps.

8. The device assembly of claim 7 wherein the RF signals radiating from the at least one antenna pass through the laminate region.

9. The device assembly of claim 7 wherein the laminate region comprises at least one conducting layer that forms the metal ground shield to reflect the RF signals radiating from the at least one antenna.

10. The device assembly of claim 9 wherein the metal ground shield has a coverage area encompassing the at least one antenna.

11. The device assembly of claim 9 wherein the at least one antenna comprises one or more planar inverted-F antennas (PIFAs) having a shorting post electrically coupled to the metal ground shield in the laminate region.

12. The device assembly of claim 9 wherein the metal mesh is provided on the upper surface of the polymer substrate and configured to control radiation patterns of the RF signals radiating from the at least one antenna and the RF signals reflected by the metal ground shield.

13. The device assembly of claim 12 wherein the attenuation switch is configured to:
    couple the metal mesh to the metal ground shield to attenuate the RF signals radiating from the at least one antenna and the RF signals reflected by the metal ground shield when the attenuation switch is closed; and
    decouple the metal mesh from the metal ground shield to not attenuate the RF signals radiating from the at least one antenna and the RF signals reflected by the metal ground shield when the attenuation switch is open.

14. The device assembly of claim 1 wherein the at least one antenna comprises one or more antennas that are driven by varying phase and amplitude to form an electrically-steerable antenna array.

15. A device assembly comprising:
    a polymer substrate having an upper surface and a lower surface;
    a laminate region having an upper surface and a lower surface;
    a silicon device layer disposed between the lower surface of the polymer substrate and the upper surface of the laminate region;
    at least one antenna provided in the silicon device layer wherein radio frequency (RF) signals radiating from the at least one antenna pass through the polymer substrate and the laminate region; and
    a metal ground shield separated from the polymer substrate by the silicon device layer;
    a metal mesh provided on the upper surface of the polymer substrate; and an attenuation switch having a first end coupled to the metal mesh and a second end coupled to the metal ground shield.

16. The device assembly of claim 15 wherein the laminate region comprises at least one conducting layer that forms the metal ground shield to reflect the RF signals radiating from the at least one antenna.

17. The device assembly of claim 16 wherein the metal ground shield has a coverage area encompassing the at least one antenna.

18. The device assembly of claim 16 wherein the metal mesh is configured to control radiation patterns of the RF signals radiating from the at least one antenna and the RF signals reflected by the metal ground shield.

19. The device assembly of claim 18 wherein the attenuation switch is configured to:
   couple the metal mesh to the metal ground shield to attenuate the RF signals radiating from the at least one antenna and the RF signals reflected by the metal ground shield when the attenuation switch is closed; and
   decouple the metal mesh from the metal ground shield to not attenuate the RF signals radiating from the at least one antenna and the RF signals reflected by the metal ground shield when the attenuation switch is open.

* * * * *